(12) United States Patent
Song (10) Patent No.: US 10,014,040 B2
(45) Date of Patent: Jul. 3, 2018

(54) SEMICONDUCTOR APPARATUS, SEMICONDUCTOR SYSTEM, AND SYSTEM RELATING TO DUAL CLOCK TRANSMISSION

(71) Applicant: SK hynix Inc., Icheon-si, Gyeonggi-do (KR)

(72) Inventor: Keun Soo Song, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/246,893

(22) Filed: Aug. 25, 2016

(65) Prior Publication Data

US 2017/0062029 A1    Mar. 2, 2017

Related U.S. Application Data

(60) Provisional application No. 62/211,613, filed on Aug. 28, 2015.

(51) Int. Cl.
*G11C 7/22* (2006.01)
*G06F 13/40* (2006.01)
*G06F 1/12* (2006.01)
*G11C 7/10* (2006.01)

(52) U.S. Cl.
CPC .............. *G11C 7/222* (2013.01); *G06F 1/12* (2013.01); *G06F 13/4068* (2013.01); *G11C 7/1066* (2013.01); *G11C 7/1072* (2013.01)

(58) Field of Classification Search
CPC ... G11C 7/222; G06F 1/12; G06F 1/08; G06F 1/06; G06F 13/4068
See application file for complete search history.

(56) References Cited

U.S. PATENT DOCUMENTS

| | | | | |
|---|---|---|---|---|
| 2011/0069560 A1* | 3/2011 | Vo | ............ | G11C 7/1027 365/189.05 |
| 2013/0136195 A1* | 5/2013 | Nygren | ............... | G06F 13/4243 375/259 |
| 2014/0355367 A1* | 12/2014 | Gay | ............ | G11C 7/222 365/193 |
| 2017/0004869 A1* | 1/2017 | Shin | ............ | G11C 11/4076 |

* cited by examiner

*Primary Examiner* — Tri Hoang
(74) *Attorney, Agent, or Firm* — William Park & Associates Ltd.

(57) ABSTRACT

A semiconductor system may include a first semiconductor apparatus, and a second semiconductor apparatus. The first semiconductor apparatus may be configured to transmit a first system clock signal and a second system clock signal having a first frequency, and transmit a data strobe signal having a second frequency. The second semiconductor apparatus may include a clock multiplier configured to generate a read data strobe signal having the second frequency, based on the first and second system clock signals.

20 Claims, 4 Drawing Sheets

SEMICONDUCTOR APPARATUS, SEMICONDUCTOR SYSTEM, AND SYSTEM RELATING TO DUAL CLOCK TRANSMISSION

CROSS-REFERENCES TO RELATED APPLICATION

The present application claims priority under 35 U.S.C. § 119(a) to U.S. provisional application No. 62/211,613, filed on Aug. 28, 2015, in the United States Patent and Trademark Office, which is incorporated herein by reference in its entirety.

BACKGROUND

1. Technical Field

Various embodiments may generally relate to a semiconductor technology, and, more particularly, to a semiconductor apparatus, semiconductor system, and system relating to dual clock transmission.

2. Related Art

Electronic apparatuses include a large number of electronic components. Among the electronic apparatuses, a computer system includes many electronic components which are constructed by semiconductors. Semiconductor apparatuses operate in synchronization with clock signals. Semiconductor apparatuses communicating with each other are coupled with each other through buses, and include interface circuits which transmit signals through the buses or receive signals through the buses. The interface circuits include transmission circuits and reception circuits.

As the operating speeds of electronic apparatuses are increased, semiconductor apparatuses are being developed to operate at higher operating speeds. As the operating speeds of semiconductor apparatuses are increased, the speeds or frequencies of clock signals are gradually increased. However, due to limitations in semiconductor processing, the development speed of interface circuits are not able to keep up with the increasing speed in the frequencies of clock signals.

SUMMARY

In an embodiment, a system may be provided. In an embodiment, a semiconductor system may be provided. In an embodiment, a semiconductor apparatus may be provided. The semiconductor apparatus may include a clock multiplier configured to receive a first system clock signal and a second system clock signal which have a first frequency, and generate a read data strobe signal having a second frequency. The semiconductor apparatus may include a data transmission circuit configured to transmit data in synchronization with the read data strobe signal.

DETAILED DESCRIPTION

Hereinafter, a semiconductor apparatus and system using dual clock transmission will be described below with reference to the accompanying drawings through various examples of embodiments.

Embodiments may provide a semiconductor apparatus and system capable of, while transmitting and receiving a relatively slow clock signal, generating a fast clock signal from the slow clock signal and operating at a high speed.

Figure 1:
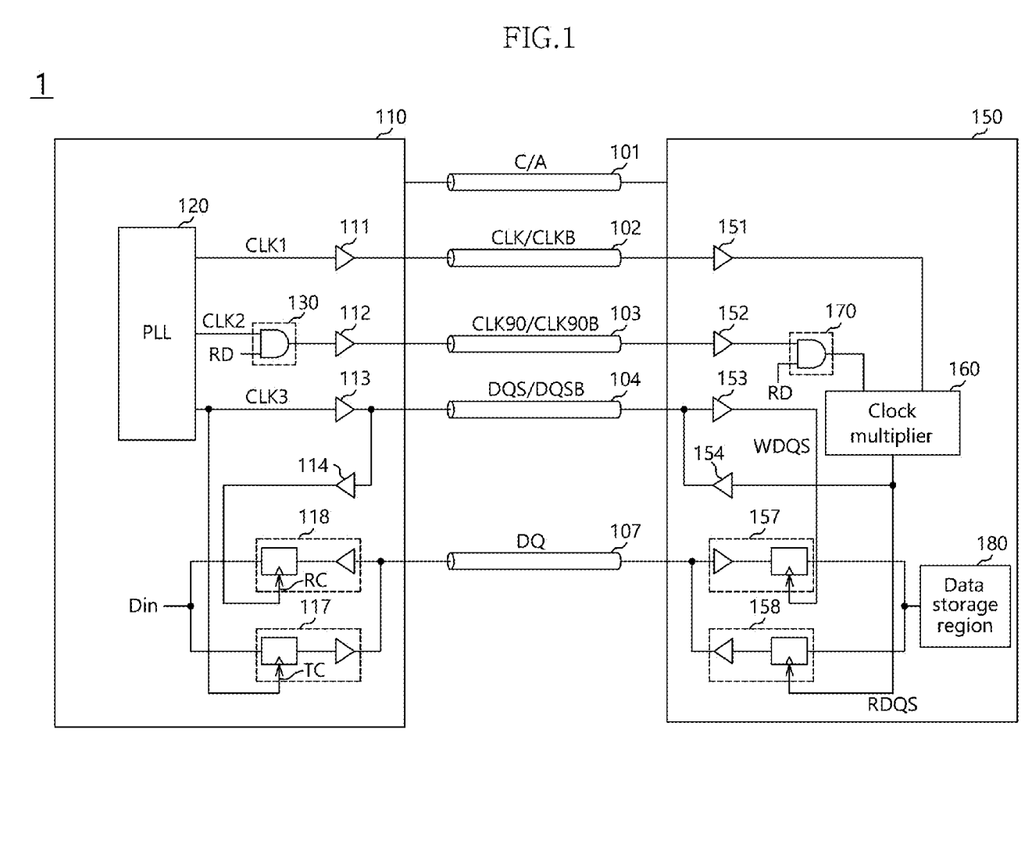
FIG. 1 is a diagram illustrating a representation of an example of the configuration of a semiconductor system in accordance with an embodiment.

FIG. 1 is a diagram illustrating a representation of an example of the configuration of a semiconductor system 1 in accordance with an embodiment. Referring to FIG. 1, the semiconductor system 1 may include a first semiconductor apparatus 110 and a second semiconductor apparatus 150. The first semiconductor apparatus 110 may be a master device which controls the second semiconductor apparatus 150, and the second semiconductor apparatus 150 may be a slave device which is controlled by the first semiconductor apparatus 110 and is able to perform various operations. For example, the first semiconductor apparatus 110 may be a host such as a processor, and the processor may include, for example but not limited to, a central processing unit (CPU), a graphic processing unit (GPU), a multimedia processor (MMP) or a digital signal processor (DSP). Also, the first semiconductor apparatus 110 may be realized in the form of a system-on-chip (SOC) by combining processor chips having various functions, such as application processors. The second semiconductor apparatus 150 may be a memory, and the memory may include a volatile memory or a nonvolatile memory. The volatile memory may include an SRAM (static RAM), a DRAM (dynamic RAM) or an SDRAM (synchronous DRAM), and the nonvolatile memory may include a ROM (read only memory), a PROM (programmable ROM), an EEPROM (electrically erasable and programmable ROM), an EPROM (electrically programmable ROM), a flash memory, a PRAM (phase change RAM), an MRAM (magnetic RAM), an RRAM (resistive RAM) or an FRAM (ferroelectric RAM).

The first and second semiconductor apparatuses 110 and 150 may be coupled with each other through a plurality of buses, and perform data communication. The buses may be signal transmission lines, channels or links. Referring to FIG. 1, the semiconductor system 1 may include a command/address bus 101, a first clock bus 102, a second clock bus 103, a strobe bus 104, and a data bus 107. The command/address bus 101 may transmit a command signal and address signal C/A. The first and second clock buses 102 and 103 may transmit system clock signals. The strobe bus 104 may transmit a data strobe signal DQS/DQSB. The data bus 107 may transmit data DQ. The command/address bus 101, the first clock bus 102 and the second clock bus 103 may be single directional signal transmission lines, and the strobe bus 104 and the data bus 107 may be bidirectional signal transmission lines.

The first semiconductor apparatus 110 and the second semiconductor apparatus 150 may perform a read operation and a write operation. The write operation may mean an operation in which the data DQ is transmitted from the first semiconductor apparatus 110 to the second semiconductor apparatus 150 and is stored in the second semiconductor apparatus 150, and the read operation may mean an operation in which data stored in the second semiconductor apparatus 150 is transmitted from the second semiconductor apparatus 150 to the first semiconductor apparatus 110. In the write operation, the first semiconductor apparatus 110 may provide, to the second semiconductor apparatus 150, the command signal and address signal C/A, the system clock signals, the data strobe signal DQS/DQSB and the data DQ. In the read operation, the first semiconductor apparatus 110 may provide, to the second semiconductor apparatus 150, the command signal and address signal C/A and the system clock signals, and the second semiconductor apparatus 150 may provide, to the first semiconductor apparatus 110, the data strobe signal DQS/DQSB and the data DQ. For example, in the write operation and the read operation, the first semiconductor apparatus 110 may provide the command signal and address signal C/A to the second semiconductor apparatus 150 through the command/address bus 101, and provide the system clock signals to the second semiconductor apparatus 150 through the first and second clock buses 102 and 103. In the write operation, the first semiconductor apparatus 110 may provide the data strobe signal DQS/DQSB to the second semiconductor apparatus 150 through the strobe bus 104, and provide the data DQ to the second semiconductor apparatus 150 through the data bus 107. In the read operation, the second semiconductor apparatus 150 may provide the data strobe signal DQS/DQSB to the first semiconductor apparatus 110 through the strobe bus 104, and provide the data DQ to the first semiconductor apparatus 110 through the data bus 107.

In an embodiment, the first semiconductor apparatus 110 may transmit a first system clock signal CLK/CLKB, a second system clock signal CLK90/CLK90B and the data strobe signal DQS/DQSB to the second semiconductor apparatus 150. The first system clock signal CLK/CLKB and the second system clock signal CLK90/CLK90B may have a first frequency, and the data strobe signal DQS/DQSB may have a second frequency. The second system clock signal CLK90/CLK90B may have a phase difference of, for example but not limited to, 90 degrees from the first system clock signal CLK/CLKB. The second frequency may be higher than the first frequency. For example, the second frequency may be two times the first frequency. The first system clock signal CLK/CLKB may be generated based on a first clock signal CLK1 which has the first frequency. The second system clock signal CLK90/CLK90B may be generated based on a second clock signal CLK2 which has the first frequency. The data strobe signal DQS/DQSB may be generated based on a third clock signal CLK3 which has the second frequency. The first semiconductor apparatus 110 may further include a phase-locked loop circuit (PLL) 120. The phase-locked loop circuit 120 may generate the first clock signal CLK1, the second clock signal CLK2 and the third clock signal CLK3.

The first semiconductor apparatus 110 may include a plurality of transmitters and receivers. The first semiconductor apparatus 110 may include a first clock transmitter 111, a second clock transmitter 112, a strobe transmitter 113 and a data transmission circuit 117, and include a strobe receiver 114 and a data reception circuit 118. The first clock transmitter 111 may be coupled with the first clock bus 102. The first clock transmitter 111 may transmit the first system clock signal CLK/CLKB generated based on the first clock signal CLK1, to the second semiconductor apparatus 150 through the first clock bus 102. The second clock transmitter 112 may be coupled with the second clock bus 103. The second clock transmitter 112 may transmit the second system clock signal CLK90/CLK90B generated based on the second clock signal CLK2, to the second semiconductor apparatus 150 through the second clock bus 103. The first system clock signal CLK may be transmitted through the first clock bus 102 together with the differential clock signal CLKB of the first system clock signal CLK, and the second system clock signal CLK90 may be transmitted through the second clock bus 103 together with the differential clock signal CLK90B of the second system clock signal CLK90.

The strobe transmitter 113 may be coupled with the strobe bus 104. The strobe transmitter 113 may generate the data strobe signal DQS/DQSB based on the third clock signal CLK3, and transmit the data strobe signal DQS/DQSB to the second semiconductor apparatus 150 through the strobe bus 104. The strobe receiver 114 may receive the data strobe signal DQS/DQSB transmitted from the second semiconductor apparatus 150. The strobe receiver 114 may generate a reception control signal RC based on the data strobe signal DQS/DQSB transmitted from the second semiconductor apparatus 150. The data transmission circuit 117 may be coupled with the data bus 107. The data transmission circuit 117 may transmit the data DQ to the second semiconductor apparatus 150, based on internal data Din of the first semiconductor apparatus 110. The data transmission circuit 117 may transmit the data DQ to the second semiconductor apparatus 150 through the data bus 107 in synchronization with a transmission control signal TC which is generated based on the third clock signal CLK3. The data reception circuit 118 may be coupled with the data bus 107. The data reception circuit 118 may receive the data DQ transmitted from the second semiconductor apparatus 150, through the data bus 107, and generate the internal data Din. The data reception circuit 118 may receive the data DQ in synchronization with the reception control signal RC.

The second semiconductor apparatus 150 may include a plurality of transmitters and receivers. The second semiconductor apparatus 150 may include a first clock receiver 151, a second clock receiver 152, a strobe receiver 153 and a data reception circuit 157, and include a strobe transmitter 154 and a data transmission circuit 158. The first clock receiver 151 may be coupled with the first clock bus 102. The first clock receiver 151 may receive the first system clock signal CLK/CLKB transmitted from the first semiconductor apparatus 110, through the first clock bus 102. The second clock receiver 152 may be coupled with the second clock bus 103. The second clock receiver 152 may receive the second system clock signal CLK90/CLK90B transmitted from the first semiconductor apparatus 110, through the second clock bus 103.

The strobe receiver 153 may be coupled with the strobe bus 104. The strobe receiver 153 may receive the data strobe signal DQS/DQSB transmitted from the first semiconductor apparatus 110, through the strobe bus 104. The strobe transmitter 154 may be coupled with the strobe bus 104. The strobe transmitter 154 may transmit the data strobe signal DQS/DQSB to the first semiconductor apparatus 110, through the strobe bus 104. The data reception circuit 157 may be coupled with the data bus 107. The data reception circuit 157 may receive the data DQ transmitted from the first semiconductor apparatus 110, through the data bus 107. The data reception circuit 157 may receive the data DQ in synchronization with a write data strobe signal WDQS, and output the received data to a data storage region 180. The received data may be stored in the data storage region 180. The data transmission circuit 158 may be coupled with the data bus 107. The data transmission circuit 158 may transmit the data stored in the data storage region 180, to the first semiconductor apparatus 110 through the data bus 107. The data transmission circuit 158 may transmit the data DQ generated based on the data stored in the data storage region 180, in synchronization with a read data strobe signal RDQS.

The second semiconductor apparatus 150 may include a clock multiplier 160. The clock multiplier 160 may receive the first and second system clock signals CLK/CLKB and CLK90/CLK90B. The clock multiplier 160 may generate the read data strobe signal RDQS based on the first and second system clock signals CLK/CLKB and CLK90/CLK90B. The read data strobe signal RDQS may have the second frequency. For example, the clock multiplier 160 may be constructed by a logic gate, for example but not limited to, an exclusive OR gate which mixes the phases of the first and second system clock signals CLK/CLKB and CLK90/CLK90B. However, it is to be noted that the embodiments are not limited thereto. The clock multiplier 160 may include any phase mixer or interpolator which generates one clock signal having the second frequency from two clock signals having the first frequency and different phases.

The second semiconductor apparatus 150 may further include a first read controller 170. The first read controller 170 may selectively receive the second system clock signal CLK90/CLK90B based on a read signal RD. The read signal RD may be generated based on a read command signal in the read operation of the semiconductor system 1. The first semiconductor apparatus 110 may further include a second read controller 130. The second read controller 130 may selectively transmit the second system clock signal CLK90/CLK90B based on the read signal RD. The second system clock signal CLK90/CLK90B may be transmitted through the second clock bus 103 in only the read operation of the semiconductor system 1, by the first and second read controllers 170 and 130. The first read controller 170 may include a logic gate, for example but not limited to, an AND gate which receives the output of the second clock receiver 152 and the read signal RD and provides an output signal to the clock multiplier 160. The second read controller 130 may include a logic gate, for example but not limited to, an AND gate which receives the second clock signal CLK2 and the read signal RD and provides an output signal to the second clock transmitter 112.

The second semiconductor apparatus 150 may generate the read data strobe signal RDQS having a high frequency, from the first and second system clock signals CLK/CLKB and CLK90/CLK90B having a relatively low frequency, through the clock multiplier 160. Since the data transmission circuit 158 transmits the data DQ in synchronization with the read data strobe signal RDQS, quicker transmission of the data may be possible. That is to say, even though the second semiconductor apparatus 150 receives a clock signal having a low speed, through a clock bus, the second semiconductor apparatus 150 may internally generate a clock signal having a high speed and perform a read operation in synchronization with the clock signal having the high speed. For example, it is assumed that the first frequency corresponds to 1.6 GHz. Although the first semiconductor apparatus 110 transmits the first and second system clock signals CLK90/CLK90B and CLK90/CLK90B of 1.6 GHz, to the second semiconductor apparatus 150, the second semiconductor apparatus 150 may generate the read data strobe signal RDQS of 3.2 GHz from the system clock signals CLK90/CLK90B and CLK90/CLK90B of 1.6 GHz, through the clock multiplier 160. The data transmission circuit 158 may transmit the data DQ in synchronization with the read data strobe signal RDQS. Accordingly, the semiconductor system 1 may perform data communication at the speed of 6.4 Gbps in the case of transmitting the data DQ through a double data rate operation.

Figure 2:
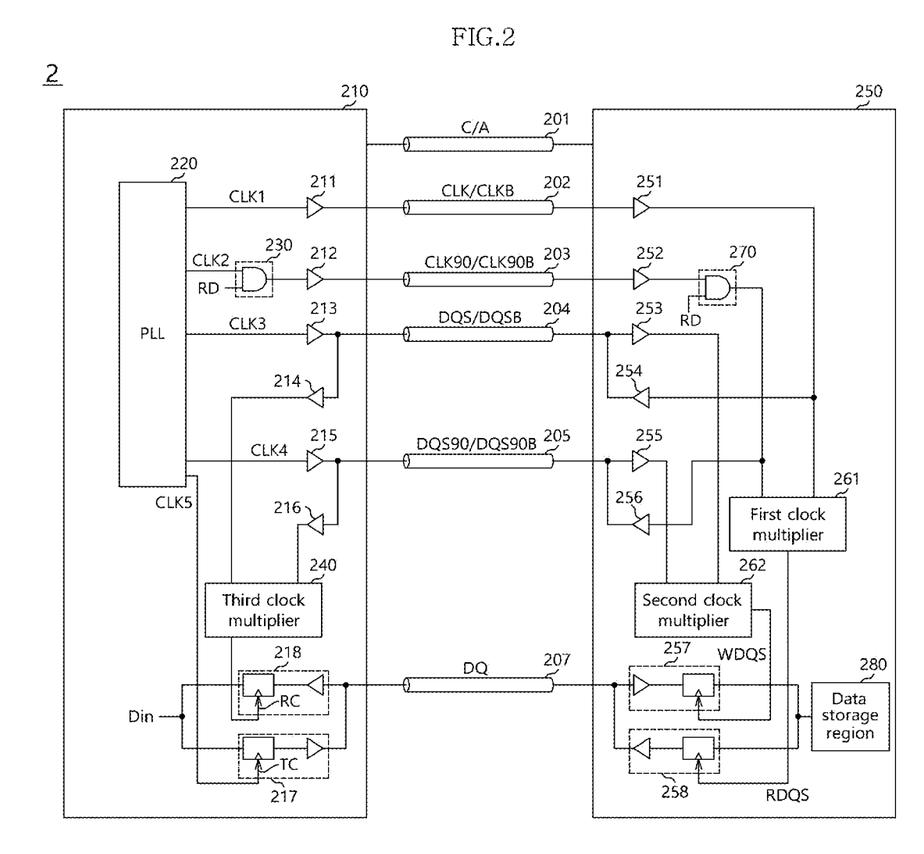
FIG. 2 is a diagram illustrating a representation of an example of the configuration of a semiconductor system in accordance with an embodiment.

FIG. 2 is a diagram illustrating a representation of an example of the configuration of a semiconductor system 2 in accordance with an embodiment. Referring to FIG. 2, the semiconductor system 2 may include a first semiconductor apparatus 210 and a second semiconductor apparatus 250. The first semiconductor apparatus 210 may be a master device, and the second semiconductor apparatus 250 may be a slave device. The first and second semiconductor apparatuses 210 and 250 may be coupled with each other through a plurality of buses. The semiconductor system 2 may include a command/address bus 201, a first clock bus 202, a second clock bus 203, a first strobe bus 204, a second strobe bus 205, and a data bus 207. The command/address bus 201 may transmit a command signal and address signal C/A. The first and second clock buses 202 and 203 may transmit system clock signals. The first and second strobe buses 204 and 205 may transmit data strobe signals. The data bus 207 may transmit data DQ.

The first semiconductor apparatus 210 may transmit a first system clock signal CLK/CLKB, a second system clock signal CLK90/CLK90B, a first data strobe signal DQS/DQSB and a second data strobe signal DQS90/DQS90B to the second semiconductor apparatus 250. In a write operation, the first semiconductor apparatus 210 may transmit the first and second data strobe signals DQS/DQSB and DQS90/DQS90B to the second semiconductor apparatus 250. The first system clock signal CLK/CLKB and the second system clock signal CLK90/CLK90B may have a first frequency and a phase difference of, for example but not limited to, 90 degrees. The first data strobe signal DQS/DQSB and the second data strobe signal DQS90/DQS90B may have the first frequency and a phase difference of, for example but not limited to, 90 degrees. The first semiconductor apparatus 210 may include a phase-locked loop circuit (PLL) 220. The phase-locked loop circuit 220 may generate a first clock signal CLK1, a second clock signal CLK2, a third clock signal CLK3 and a fourth clock signal CLK4. All of the first to fourth clock signals CLK1, CLK2, CLK3 and CLK4 may have the first frequency. The second clock signal CLK2 may have a phase difference of, for example but not limited to, 90 degrees from the first clock signal CLK1, and the fourth clock signal CLK4 may have a phase difference of, for example but not limited to, 90 degrees from the third clock signal CLK3. The third clock signal CLK3 may be a clock signal which has the same phase as the first clock signal CLK1, and the fourth clock signal CLK4 may be a clock signal which has the same phase as the second clock signal CLK2. The first system clock signal CLK/CLKB may be generated based on the first clock signal CLK1, and the second system clock signal CLK90/CLK90B may be generated based on the second clock signal CLK2. The first data strobe signal DQS/DQSB may be generated based on the third clock signal CLK3, and the second data strobe signal DQS90/DQS90B may be generated based on the fourth clock signal CLK4.

The second semiconductor apparatus 250 may include a first clock multiplier 261 and a second clock multiplier 262. The first clock multiplier 261 may receive the first and second system clock signals CLK/CLKB and CLK90/CLK90B. The first clock multiplier 261 may generate a read data strobe signal RDQS based on the first and second system clock signals CLK/CLKB and CLK90/CLK90B. The read data strobe signal RDQS may have a second frequency. The second frequency may be higher than the first frequency. For example, the second frequency may be two times the first frequency. The second clock multiplier 262 may receive the first and second data strobe signals DQS/DQSB and DQS90/DQS90B. The second clock multiplier 262 may generate a write data strobe signal WDQS based on the first and second data strobe signals DQS/DQSB and DQS90/DQS90B. The write data strobe signal WDQS may have the second frequency. In an embodiment, the first clock multiplier 261 may include a phase mixer or interpolator which combines the first and second system clock signals CLK/CLKB and CLK90/CLK90B having the low frequency and generates the read data strobe signal RDQS having the high frequency. For example, the first clock multiplier 261 may include a logic gate, for example but not limited to, an exclusive OR gate. The second clock multiplier 262 may include a logic gate, for example but not limited to, an exclusive OR gate, and generate the write data strobe signal WDQS having the high frequency, based on the first and second data strobe signals DQS/DQSB and DQS90/DQS90B having the low frequency.

The second semiconductor apparatus 250 may transmit the first and second data strobe signals DQS/DQSB and DQS90/DQS90B to the first semiconductor apparatus 210. The second semiconductor apparatus 250 may transmit the first and second data strobe signals DQS/DQSB and DQS90/DQS90B through the first and second strobe buses 204 and 205 in a read operation. The second semiconductor apparatus 250 may transmit the first data strobe signal DQS/DQSB generated based on the first system clock signal CLK/CLKB, to the first semiconductor apparatus 210 through the first strobe bus 204. The second semiconductor apparatus 250 may transmit the second data strobe signal DQS90/DQS90B generated based on the second system clock signal CLK90/CLK90B, to the first semiconductor apparatus 210 through the second strobe bus 205. Accordingly, the first and second data strobe signals DQS/DQSB and DQS90/DQS90B transmitted from the second semiconductor apparatus 250 to the first semiconductor apparatus 210 may have the first frequency in the same manner as the first and second system clock signals CLK/CLKB and CLK90/CLK90B, and have the phase difference of, for example but not limited to, 90 degrees.

The first semiconductor apparatus 210 may include a third clock multiplier 240. The third clock multiplier 240 may receive the is first and second data strobe signals DQS/DQSB and DQS90/DQS90B transmitted from the second semiconductor apparatus 250. The third clock multiplier 262 may generate a reception control signal RC based on the first and second data strobe signals DQS/DQSB and DQS90/DQS90B. The reception control signal RC may have the second frequency. The third clock multiplier 240 may include a logic gate, for example but not limited to, an exclusive OR gate, and generate the reception control signal RC having the high frequency, based on the first and second data strobe signals DQS/DQSB and DQS90/DQS90B having the low frequency.

The first semiconductor apparatus 210 may include a plurality of transmitters and receivers. The first semiconductor apparatus 210 may include a first clock transmitter 211, a second clock transmitter 212, a first strobe transmitter 213, a first strobe receiver 214, a second strobe transmitter 215, a second strobe receiver 216, a data transmission circuit 217, and a data reception circuit 218. The first clock transmitter 211 may generate the first system clock signal CLK/CLKB based on the first clock signal CLK1, and transmit the first system clock signal CLK/CLKB to the second semiconductor apparatus 250 through the first clock bus 202. The second clock transmitter 212 may generate the second system clock signal CLK90/CLK90B based on the second clock signal CLK2, and transmit the second system clock signal CLK90/CLK90B to the second semiconductor apparatus 250 through the second clock bus 203.

The first strobe transmitter 213 may generate the first data strobe signal DQS/DQSB based on the third clock signal CLK3, and transmit the first data strobe signal DQS/DQSB to the second semiconductor apparatus 250 through the first strobe bus 204. The first strobe receiver 214 may receive the first data strobe signal DQS/DQSB transmitted through the first strobe bus 204 from the second semiconductor apparatus 250. The second strobe transmitter 215 may generate the second data strobe signal DQS90/DQS90B based on the fourth clock signal CLK4, and transmit the second data strobe signal DQS90/DQS90B to the second semiconductor apparatus 250 through the second strobe bus 205. The second strobe receiver 216 may receive the second data strobe signal DQS90/DQS90B transmitted through the second strobe bus 205 from the second semiconductor apparatus 250. The data transmission circuit 217 may receive a transmission control signal TC and internal data Din of the first semiconductor apparatus 210. The data transmission circuit 217 may output the internal data Din as the data DQ in synchronization with the transmission control signal TC. The data transmission circuit 217 may transmit the data DQ to the second semiconductor apparatus 250 through the data bus 207. The data reception circuit 218 may receive the reception control signal RC and the data DQ. The data reception circuit 218 may receive the data DQ transmitted from the second semiconductor apparatus 250, through the data bus 207. The data reception circuit 218 may receive the data DQ in synchronization with the reception control signal RC, and generate the internal data Din from the received data.

The phase-locked loop circuit 220 may further generate a fifth clock signal CLK5. The fifth clock signal CLK5 may have the second frequency. The fifth clock signal CLK5 generated from the phase-locked loop circuit 220 may be provided as the transmission control signal TC. Accordingly, the transmission control signal TC may have the second frequency.

The second semiconductor apparatus 250 may include a plurality of transmitters and receivers. The second semiconductor apparatus 250 may include a first clock receiver 251, a second clock receiver 252, a first strobe receiver 253, a first strobe transmitter 254, a second strobe receiver 255, a second strobe transmitter 256, a data reception circuit 257, and a data transmission circuit 258. The first clock receiver 251 may be coupled with the first clock bus 202, and receive the first system clock signal CLK/CLKB transmitted from the first semiconductor apparatus 210. The second clock receiver 252 may be coupled with the second clock bus 203, and receive the second system clock signal CLK90/CLK90B transmitted from the first semiconductor apparatus 210. The first strobe receiver 253 may be coupled with the first strobe bus 204, and receive the first data strobe signal DQS/DQSB transmitted from the first semiconductor apparatus 210, through the first strobe bus 204. The first strobe transmitter 254 may be coupled with the first strobe bus 204, and transmit the first data strobe signal DQS/DQSB generated based on the first system clock signal CLK/CLKB, to the first semiconductor apparatus 210. The second strobe receiver 255 may be coupled with the second strobe bus 205, and receive the second data strobe signal DQS90/DQS90B transmitted from the first semiconductor apparatus 210, through the second strobe bus 205. The second strobe transmitter 256 may be coupled with the second strobe bus 205, and transmit the second data strobe signal DQS90/DQS90B generated based on the second system clock signal CLK90/CLK90B, to the first semiconductor apparatus 210.

Each of the data reception circuit 257 and the data transmission circuit 258 may be coupled with the data bus 207 and a data storage region 280 of the second semiconductor apparatus 250. The data reception circuit 257 may receive the write data strobe signal WDQS. The data reception circuit 257 may receive the data DQ transmitted from the first semiconductor apparatus 210, through the data bus 207, in synchronization with the write data strobe signal WDQS, and the received data may be stored in the data storage region 280. The data transmission circuit 258 may receive the read data strobe signal RDQS. The data transmission circuit 258 may transmit the data DQ generated based on the data stored in the data storage region 280, through the data bus 207, in synchronization with the read data strobe signal RDQS.

The second semiconductor apparatus 250 may further include a first read controller 270. The first read controller 270 may selectively receive the second system clock signal CLK90/CLK90B based on a read signal RD. The read signal RD may be generated based on a read command signal in the read operation of the semiconductor system 2. The first semiconductor apparatus 210 may further include a second read controller 230. The second read controller 230 may selectively transmit the second system clock signal CLK90/CLK90B based on the read signal RD. The second system clock signal CLK90/CLK90B may be transmitted through the second clock bus 203 in only the read operation of the semiconductor system 2, by the first and second read controllers 270 and 230.

In the semiconductor system 2, all the signals transmitted through the first and second clock buses 202 and 203 and the first and second strobe buses 204 and 205 may have the low frequency. Therefore, the first and second semiconductor apparatuses 210 and 250 need not include transmitters and receivers having high performance. Since the first and second semiconductor apparatuses 210 and 250 may internally generate clock signals having the high frequency by including the clock multipliers 261, 262 and 240, the transmission speed of data may be increased. For example, while the first and second system clock signals CLK/CLKB and CLK90/CLK90B and the first and second data strobe signal DQS/DQSB and DQS90/DQS90B have the frequency of 1.6 GHz, the read data strobe signal RDQS and the write data strobe signal WDQS may have the frequency of 3.2 GHz. Accordingly, when a double data rate operation is performed, the data DQ may be transmitted at the speed of 6.4 Gbps through the data bus 207.

Figure 3:
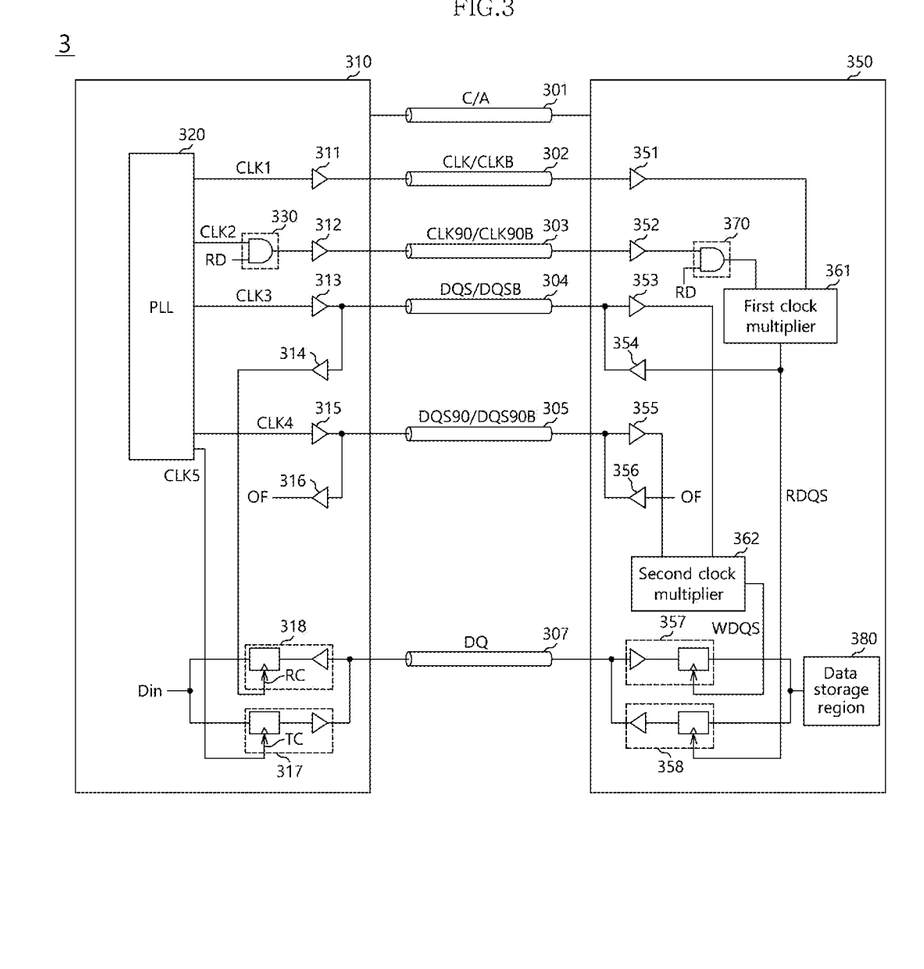
FIG. 3 is a diagram illustrating a representation of an example of the configuration of a semiconductor system in accordance with an embodiment.

FIG. 3 is a diagram illustrating a representation of an example of the configuration of a semiconductor system 3 in accordance with an embodiment. Referring to FIG. 3, the semiconductor system 3 may include a first semiconductor apparatus 310 and a second semiconductor apparatus 350. The first semiconductor apparatus 310 may be a master device, and the second semiconductor apparatus 350 may be a slave device. The first and second semiconductor apparatuses 310 and 350 may be coupled with each other through a command/address bus 301, a first clock bus 302, a second clock bus 303, a first strobe bus 304, a second strobe bus 305, and a data bus 307. The first semiconductor apparatus 310 may transmit a first system clock signal CLK/CLKB through the first clock bus 302, and transmit a second system clock signal CLK90/CLK90B through the second clock bus 303. The first semiconductor apparatus 310 may transmit a first data strobe signal DQS/DQSB through the first strobe bus 304, and transmit a second data strobe signal DQS90/DQS90B through the second strobe bus 305. The first system clock signal CLK/CLKB and the second system clock signal CLK90/CLK90B may have a first frequency and a phase difference of, for example but not limited to, 90 degrees. The first data strobe signal DQS/DQSB and the second data strobe signal DQS90/DQS90B may have the first frequency and a phase difference of, for example but not limited to, 90 degrees.

The first semiconductor apparatus 310 may include a phase-locked loop circuit (PLL) 320. The phase-locked loop circuit 320 may generate a first clock signal CLK1, a second clock signal CLK2, a third clock signal CLK3, a fourth clock signal CLK4, and a fifth clock signal CLK5. The first system clock signal CLK/CLKB may be generated based on the first clock signal CLK1, and the second system clock signal CLK90/CLK90B may be generated based on the second clock signal CLK2. The first data strobe signal DQS/DQSB may be generated based on the third clock signal CLK3, and the second data strobe signal DQS90/DQS90B may be generated based on the fourth clock signal CLK4. The first and second clock signals CLK1 and CLK2 may have the first frequency and a phase difference of, for example but not limited to, 90 degrees. The third and fourth clock signals CLK3 and CLK4 may have the first frequency and a phase difference of, for example but not limited to, 90 degrees. The third clock signal CLK3 may be a signal which has the same phase as the first clock signal CLK1, and the fourth clock signal CLK4 may be a signal which has the same phase as the second clock signal CLK2. The fifth clock signal CLK5 may be provided as a transmission control signal TC to be used in a data transmission circuit 317 of the first semiconductor apparatus 310 as will be described later.

The second semiconductor apparatus 350 may include first and second clock multipliers 361 and 362. The first clock multiplier 361 may receive the first and second system clock signals CLK/CLKB and CLK90/CLK90B. The first clock multiplier 361 may generate a read data strobe signal RDQS based on the first and second system clock signals CLK/CLKB and CLK90/CLK90B. The read data strobe signal RDQS may have a second frequency. For example, the second frequency may be two times the first frequency. The second clock multiplier 362 may receive the first and second data strobe signals DQS/DQSB and DQS90/DQS90B. The second clock multiplier 362 may generate a write data strobe signal WDQS based on the first and second data strobe signals DQS/DQSB and DQS90/DQS90B. The write data strobe signal WDQS may have the second frequency. In a read operation, the second semiconductor apparatus 350 may output the read data strobe signal RDQS generated from the first clock multiplier 361, to the first strobe bus 304. The second semiconductor apparatus 350 may transmit the read data strobe signal RDQS as the first data strobe signal DQS/DQSB to the first semiconductor apparatus 310.

The first semiconductor apparatus 310 may include a plurality of transmitters and receivers. The first semiconductor apparatus 310 may include a first clock transmitter 311, a second clock transmitter 312, a first strobe transmitter 313, a first strobe receiver 314, a second strobe transmitter 315, a data transmission circuit 317, and a data reception circuit 318. The second semiconductor apparatus 350 may include a plurality of transmitters and receivers. The second semiconductor apparatus 350 may include a first clock receiver 351, a second clock receiver 352, a first strobe receiver 353, a first strobe transmitter 354, a second strobe receiver 355, a data reception circuit 317, and a data transmission circuit 318. The first strobe transmitter 354 may generate the first data strobe signal DQS/DQSB based on the read data strobe signal RDQS, and transmit the first data strobe signal DQS/DQSB to the first semiconductor apparatus 310 through the first strobe bus 304. Referring to FIG. 3, the semiconductor system 3 may include components similar to those of the semiconductor system 2 of FIG. 2, and components having similar reference numbers may perform the same functions. Repetitive descriptions for components which perform substantially the same functions may be omitted.

Referring to FIG. 3, the second semiconductor apparatus 350 may transmit the first data strobe signal DQS/DQSB generated based on the read data strobe signal RDQS which is generated from the first clock multiplier 361 and has the second frequency, to the first semiconductor apparatus 310 through the first strobe bus 304. Although the second strobe bus 305 transmits the second data strobe signal DQS90/DQS90B in a write operation of the semiconductor system 3, the second strobe bus 305 need not be used during the read operation of the semiconductor system 3. The first semiconductor apparatus 310 may generate a reception control signal RC based on the first data strobe signal DQS/DQSB transmitted from the second semiconductor apparatus 350. Thus, the first semiconductor apparatus 310 need not include the second strobe receiver 216 as illustrated in FIG. 2, and the second semiconductor apparatus 350 need not include the second strobe transmitter 256 as illustrated in FIG. 2. Also, the first semiconductor apparatus 310 need not include separately the clock multiplier 240 as illustrated in FIG. 2. Nevertheless, in an embodiment, the first semiconductor apparatus 310 may further include a second strobe receiver 316 which forms a pair with the second strobe transmitter 315, and the second semiconductor apparatus 350 may further include a second strobe transmitter 356 which forms a pair with the second strobe receiver 355. The second strobe transmitter 356 of the second semiconductor apparatus 350 may be used to transmit various control signals OF. Without a limiting sense, for example, the control signals OF may include at least one of a data bus inversion information which informs whether data is inverted or not and an error correction code (ECC) information or a cyclic redundancy check (CRC) information which is used for data error correction. During the read operation of the semiconductor system 3, the second semiconductor apparatus 350 may transmit the various control signals OF to the first semiconductor apparatus 310 through the second strobe transmitter 356 and the second strobe bus 305, and the first semiconductor apparatus 310 may receive the various control signals OF through the second strobe receiver 316 and thereby utilize the second strobe bus 305.

Referring to FIG. 3, the second semiconductor apparatus 350 may further include a first read controller 370. The first read controller 370 may selectively receive the second system clock signal CLK90/CLK90B based on a read signal RD. The first semiconductor apparatus 310 may include a second read controller 330. The second read controller 330 may selectively transmit the second system clock signal CLK90/CLK90B based on the read signal RD.

The semiconductor systems and semiconductor apparatuses as discussed above (see FIGS. 1-3) are particular useful in the design of other memory devices, processors, and computer systems. For example, referring to FIG. 4, a block diagram of a system employing a semiconductor system and or semiconductor apparatus in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

Figure 4:
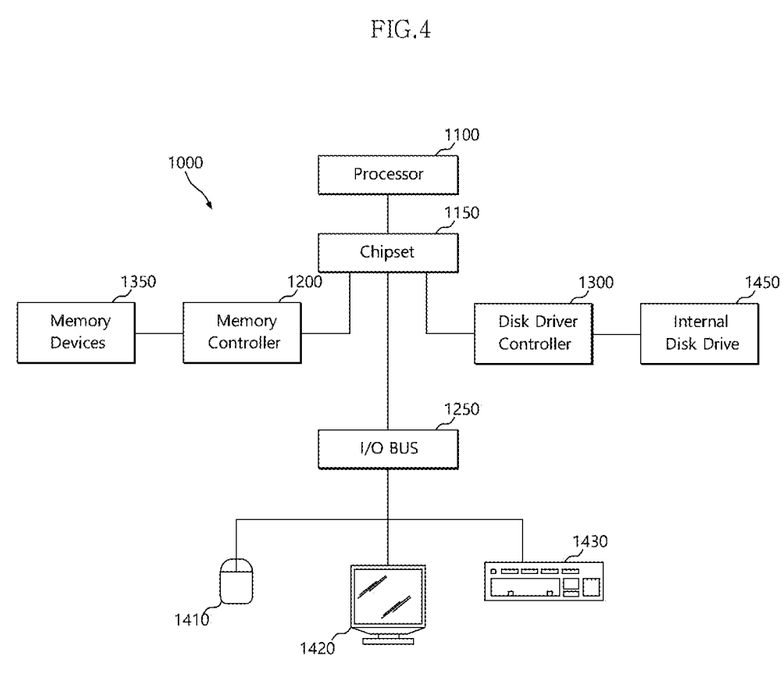
FIG. 4 illustrates a block diagram of an example of a representation of a system employing a semiconductor system and or a semiconductor apparatus with the various embodiments discussed above with relation to FIGS. 1-3.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor system and or semiconductor apparatus as discussed above with reference to FIGS. 1-3. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor system and or semiconductor apparatus as discussed above with relation to FIGS. 1-3, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 4 is merely one example of a semiconductor system and or semiconductor apparatus as discussed above with relation to FIGS. 1-3. In alternate embodiments, such as, for example but not limited to, cellular phones or digital cameras, the components may differ from the embodiments illustrated in FIG. 4.

While various embodiments have been described above, it will be understood to those skilled in the art that the embodiments described are examples only. Accordingly, the semiconductor apparatus and system using dual clock transmission described herein should not be limited based on the described embodiments.

What is claimed is:

1. A semiconductor system comprising:
   a first semiconductor apparatus; and
   a second semiconductor apparatus,
   wherein the first semiconductor apparatus transmits a first system clock signal and a second system clock signal having a first frequency, and transmits a data strobe signal having a second frequency which is higher than the first frequency,
   wherein the second semiconductor apparatus includes a clock multiplier which generates a read data strobe signal having the second frequency, based on the first and second system clock signals, and
   wherein the second semiconductor apparatus further includes a first read controller which selectively receives the second system clock signal based on a read signal.

2. The semiconductor system according to claim 1, wherein there is a phase difference between the second system clock signal and the first system clock signal.

3. The semiconductor system according to claim 1,
   wherein the first semiconductor apparatus includes a phase-locked loop circuit which generates a first clock signal and a second clock signal having the first frequency and further generates a third clock signal having the second frequency, and
   wherein the first system clock signal is generated based on the first clock signal, the second system clock signal is generated based on the second clock signal, and the data strobe signal is generated based on the third clock signal.

4. The semiconductor system according to claim 1,
   wherein the first and second semiconductor apparatuses are coupled through a data bus, and
   wherein the second semiconductor apparatus further includes a data transmission circuit which outputs data stored in a data storage region, to the data bus, in synchronization with the read data strobe signal.

5. The semiconductor system according to claim 4, wherein the second semiconductor apparatus further includes a data reception circuit which receives data transmitted through the data bus, in synchronization with a write data strobe signal which is generated based on the data strobe signal.

6. The semiconductor system according to claim 1, wherein the first semiconductor apparatus further includes a second read controller which selectively transmits the second system clock signal based on the read signal.

7. A semiconductor system comprising:
   a first semiconductor apparatus; and
   a second semiconductor apparatus,
   wherein the first semiconductor apparatus transmits a first system clock signal, a second system clock signal, a first data strobe signal and a second data strobe signal which have a first frequency, to the second semiconductor apparatus, and
   wherein the second semiconductor apparatus includes a first clock multiplier which generates a read data strobe signal having a second frequency, based on the first and second system clock signals, and a second clock multiplier which generates a write data strobe signal having the second frequency, based on the first and second data strobe signals.

8. The semiconductor system according to claim 7, wherein there is a phase difference between the second system clock signal and the first system clock signal.

9. The semiconductor system according to claim 7, wherein there is a phase difference between the second data strobe signal and the first data strobe signal.

10. The semiconductor system according to claim 8, wherein the first system clock signal and the first data strobe signal have the same phase and the second system clock signal and the second data strobe signal have the same phase.

11. The semiconductor system according to claim 7,
    wherein the first semiconductor apparatus includes a phase-locked loop circuit which generates a first clock signal, a second clock signal, a third clock signal and a fourth clock signal having the first frequency, and further generates a fifth clock signal having the second frequency,
    wherein the first system clock signal is generated based on the first clock signal, the second system clock signal is generated based on the second clock signal, the first data strobe signal is generated based on the third clock signal, and the second data strobe signal is generated based on the fourth clock signal,
    wherein the second semiconductor apparatus generates the first and second data strobe signals based on the first and second system clock signals, and transmits the first and second data strobe signals to the first semiconductor apparatus, and
    wherein the first semiconductor apparatus further includes a third clock multiplier which generates a reception control signal having the second frequency, based on the first and second data strobe signals.

12. The semiconductor system according to claim 11,
    wherein the first and second semiconductor apparatuses are coupled through a data bus, and
    wherein the first semiconductor apparatus further includes a data transmission circuit which outputs internal data to the data bus, in synchronization with a transmission control signal generated based on the fifth clock signal.

13. The semiconductor system according to claim 12, wherein the first semiconductor apparatus further includes a data reception circuit which receives data transmitted from the data bus in synchronization with the reception control signal and generates the internal data.

14. The semiconductor system according to claim 7,
    wherein the first and second semiconductor apparatuses are coupled through a data bus, and
    wherein the second semiconductor apparatus further includes a data transmission circuit which outputs data stored in a data storage region, to the data bus, in synchronization with the read data strobe signal.

15. The semiconductor system according to claim 14, wherein the second semiconductor apparatus further includes a data reception circuit which receives data transmitted through the data bus, in synchronization with the write data strobe signal.

16. The semiconductor system according to claim 7, wherein the second semiconductor apparatus further includes a first read controller which selectively receives the second system clock signal based on a read signal.

17. The semiconductor system according to claim 16, wherein the first semiconductor apparatus further includes a second read controller which selectively transmits the second system clock signal based on the read signal.

18. The semiconductor system according to claim 7,
wherein the first data strobe signal is transmitted through a first strobe bus, and the second data strobe signal is transmitted through a second strobe bus, and
wherein the second semiconductor apparatus generates the first data strobe signal based on the read data strobe signal during a read operation, and transmits the first data strobe signal through the first strobe bus to the first semiconductor apparatus.

19. The semiconductor system according to claim 18, wherein the first semiconductor apparatus receives data transmitted from the second semiconductor apparatus, in synchronization with a reception control signal generated based on the first data strobe signal received from the second semiconductor apparatus.

20. The semiconductor system according to claim 18, wherein the second semiconductor apparatus transmits at least one of a data bus inversion information, an error correction code (ECC) information and a cyclic redundancy check (CRC) information, through the second strobe bus during the read operation.

\* \* \* \* \*